(12) United States Patent
Pang et al.

(10) Patent No.: US 8,928,350 B2
(45) Date of Patent: Jan. 6, 2015

(54) PROGRAMMING THE BEHAVIOR OF INDIVIDUAL CHIPS OR STRATA IN A 3D STACK OF INTEGRATED CIRCUITS

(75) Inventors: Liang-Teck Pang, White Plains, NY (US); Joel A. Silberman, Somers, NY (US); Matthew R. Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 13/607,020

(22) Filed: Sep. 7, 2012

(65) Prior Publication Data

US 2013/0049796 A1 Feb. 28, 2013

Related U.S. Application Data

(63) Continuation of application No. 13/217,734, filed on Aug. 25, 2011, now Pat. No. 8,519,735.

(51) Int. Cl.
*H03K 19/173* (2006.01)
*G01R 31/3185* (2006.01)
*H01L 25/065* (2006.01)

(52) U.S. Cl.
CPC *G01R 31/318558* (2013.01); *G01R 31/318513* (2013.01); *G01R 31/318572* (2013.01); *H01L 25/0657* (2013.01)
USPC .................................. 326/38; 326/39; 326/41

(58) Field of Classification Search
None
See application file for complete search history.

(56) References Cited

U.S. PATENT DOCUMENTS

| | | | |
|---|---|---|---|
| 4,868,712 A | 9/1989 | Woodman | |
| 5,200,631 A | 4/1993 | Austin et al. | |
| 5,280,184 A | 1/1994 | Jokerst et al. | |
| 5,655,290 A | 8/1997 | Moresco et al. | |
| 5,702,984 A | 12/1997 | Bertin et al. | |
| 5,968,196 A * | 10/1999 | Ramamurthy et al. | ........ 714/727 |
| 6,141,245 A | 10/2000 | Bertin et al. | |
| 6,258,623 B1 | 7/2001 | Moden et al. | |
| 6,569,762 B2 | 5/2003 | Kong | |
| 6,842,039 B1 * | 1/2005 | Guzman et al. | ................. 326/38 |
| 6,982,869 B2 | 1/2006 | Larson | |
| 7,021,520 B2 | 4/2006 | Bowen | |

(Continued)

FOREIGN PATENT DOCUMENTS

FR 2946182 A1 12/2010

OTHER PUBLICATIONS

Badaroglu et al., "Clock-skew-optimization methodology for substrate-noise reduction with supply-current folding" ICCAD, vol. 25. No. 6, pp. 1146-1154, Jun. 2006.

(Continued)

*Primary Examiner* — Crystal L Hammond
(74) *Attorney, Agent, or Firm* — Tutunjian & Bitetto, P.C.; Louis J. Percello

(57) ABSTRACT

There is provided a strata manager within a 3D chip stack having two or more strata. The strata manager includes a plurality of scannable configuration registers, each being arranged on a respective one of the two or more strata for storing a set of bits. The set of bits is configured to program an operation of a corresponding one of the two or more strata on which the set of bits is stored or a device thereon. Additionally, a stratum identifier within a 3D stack and stack-wide scan circuit within a 3D stack are provided.

23 Claims, 12 Drawing Sheets

(56) References Cited

U.S. PATENT DOCUMENTS

| | | | |
|---|---|---|---|
| 7,030,486 | B1 | 4/2006 | Marshall |
| 7,067,910 | B2 | 6/2006 | Drost et al. |
| 7,240,148 | B2 * | 7/2007 | Teng ............................ 711/105 |
| 7,521,950 | B2 | 4/2009 | Bernstein et al. |
| 7,615,869 | B2 | 11/2009 | Koo et al. |
| 7,623,398 | B2 | 11/2009 | Arai |
| 7,701,251 | B1 | 4/2010 | Rahman et al. |
| 7,710,329 | B2 | 5/2010 | Chiozzi |
| 7,730,248 | B2 * | 6/2010 | Goss et al. ..................... 710/261 |
| 7,753,779 | B2 | 7/2010 | Shayesteh |
| 7,768,790 | B2 | 8/2010 | Kuroda et al. |
| 7,772,708 | B2 | 8/2010 | Leddige et al. |
| 7,830,692 | B2 | 11/2010 | Chung et al. |
| 7,863,960 | B2 | 1/2011 | Wang et al. |
| 2002/0089831 | A1 | 7/2002 | Forthun |
| 2004/0177237 | A1 | 9/2004 | Huppenthal et al. |
| 2005/0058128 | A1 | 3/2005 | Carson et al. |
| 2006/0043598 | A1 | 3/2006 | Kirby et al. |
| 2007/0001379 | A1 | 1/2007 | Oh |
| 2007/0033562 | A1 | 2/2007 | Corraele et al. |
| 2007/0047284 | A1 | 3/2007 | Silvestri |
| 2007/0132070 | A1 | 6/2007 | Buot et al. |
| 2007/0287224 | A1 | 12/2007 | Alam et al. |
| 2007/0290333 | A1 | 12/2007 | Saini et al. |
| 2008/0068039 | A1 | 3/2008 | Bernstein et al. |
| 2008/0204091 | A1 | 8/2008 | Choo et al. |
| 2009/0024789 | A1 | 1/2009 | Rajan et al. |
| 2009/0055789 | A1 | 2/2009 | McIlrath |
| 2009/0064058 | A1 | 3/2009 | McIlrath |
| 2009/0070549 | A1 | 3/2009 | Solomon |
| 2009/0070721 | A1 | 3/2009 | Solomon |
| 2009/0168860 | A1 | 7/2009 | Magagni et al. |
| 2009/0179549 | A1 * | 7/2009 | Abe et al. ..................... 313/501 |
| 2009/0196312 | A1 | 8/2009 | Kuroda |
| 2009/0237970 | A1 | 9/2009 | Chung |
| 2009/0245445 | A1 | 10/2009 | Saen et al. |
| 2009/0323456 | A1 | 12/2009 | Gomm |
| 2010/0005437 | A1 | 1/2010 | Mcilrath |
| 2010/0044846 | A1 | 2/2010 | Ohmi et al. |
| 2010/0059869 | A1 | 3/2010 | Kaskoun et al. |
| 2010/0332193 | A1 | 12/2010 | Hu et al. |
| 2011/0016446 | A1 | 1/2011 | Krebd |
| 2011/0032130 | A1 | 2/2011 | Ludwig |
| 2011/0121811 | A1 | 5/2011 | Dennard et al. |

OTHER PUBLICATIONS

Chan et al., "A Resonant Global Clock Distribution for the Cell Broadband Engine Processor" IEEE J. Solid State Circuits, vol. 44, No. 1, pp. 64-72, Jan. 2009.

Gutnik et al., "Active GHz Clock Network Using Distributed PLLs" IEEE JSSC, vol. 35, No. 11, pp. 1553-1560, Nov. 2000.

Lam et al., "Power supply noise suppression via clock skew scheduling," in Proceedings of International Symposium on Quality Electronic Design, pp. 355-360, Mar. 2002.

Miura et al., "A 2.7Gb/s/mm2 0.9pj/b/Chip 1Coil/Channel ThruChip Interface with Coupled-Resonator-Based CDR for NAND Flash Memory Stacking," ISSCC, pp. 490-491, Feb. 2011.

Pavlidis et al., "Clock distribution networks for 3-D integrated Circuits", IEEE CICC, pp. 651-654, Sep. 2008.

Restle et al., "A Clock Distribution Method for Microprocessors", IEEE JSSC, vol. 36, No. 5, pp. 792-799, May 2001.

Tam et al., "Clock Generation and distribution for the first IA-64 Microprocessor", IEEE JSSC vol. 35, No. 11, pp. 1545-1552, Nov. 2000.

* cited by examiner

PROGRAMMING THE BEHAVIOR OF INDIVIDUAL CHIPS OR STRATA IN A 3D STACK OF INTEGRATED CIRCUITS

CROSS-REFERENCE TO RELATED APPLICATIONS

This application is a Continuation application of co-pending U.S. patent application Ser. No. 13/217,734 filed on Aug. 25, 2011, incorporated herein by reference in its entirety.

This application is related to the following commonly assigned applications, all concurrently filed on Aug. 25, 2011 and incorporated herein by reference: U.S. application Ser. No. 13/217,335, entitled "SYNCHRONIZING GLOBAL CLOCKS IN 3D STACKS OF INTEGRATED CIRCUITS BY SHORTING THE CLOCK NETWORK"; U.S. application Ser. No. 13/217,349, entitled "3D CHIP STACK SKEW REDUCTION WITH RESONANT CLOCK AND INDUCTIVE COUPLING"; U.S. application Ser. No. 13/217,767, entitled "3D INTEGRATED CIRCUIT STACK-WIDE SYNCHRONIZATION CIRCUIT"; U.S. application Ser. No. 13/217,789, entitled "CONFIGURATION OF CONNECTIONS IN A 3D STACK OF INTEGRATED CIRCUITS"; U.S. application Ser. No. 13/217,381, entitled "3D INTER-STRATUM CONNECTIVITY ROBUSTNESS"; U.S. application Ser. No. 13/217,406, entitled "AC SUPPLY NOISE REDUCTION IN A 3D STACK WITH VOLTAGE SENSING AND CLOCK SHIFTING"; and U.S. application Ser. No. 13/217,429, entitled "VERTICAL POWER BUDGETING AND SHIFTING FOR 3D INTEGRATION".

BACKGROUND

1. Technical Field

The present invention relates generally to integrated circuits and, in particular, to programming the behavior of individual chips, or strata in a 3D stack of integrated circuits.

2. Description of the Related Art

To construct a 3D (i.e., multiple stratum) stacked integrated circuit (IC), it is desirable to first test individual chips before joining them into a 3D stack. However, the off-stratum inputs and outputs (I/Os) that must operate while an unstacked stratum (chip) is being tested may be different from the I/Os that must operate when the stratum is in a stack. A similar situation can exist for the clock source. While each chip may need its own clock source for test, the clock source in a stack may come from one selected stratum. Also, it may be desirable to make the stack out of functionally or physically equivalent chips that may differ only in their address assignment. For example, while a stacked memory integrated circuit may functionally include identical memory chips, the activation of a particular stratum would depend on the address accessed. A cost savings can be realized if these memory dies are physically identical.

One solution to the test/operation problem could be to provide separate stack I/Os that correspond to a set of control I/O pins, or data I/O pins connected in the stack with inclined through-Silicon via (TSV) connections such that each individual stratum remained accessible, from C4's or pads or other off-stack connection, once the stack was built. The values on these control pins could be set by the package wiring to "personalize" the stack. However, this solution requires a large number of stack I/O's and a large number of inclined TSVs, especially when stacking multiple strata. Inclined TSVs are disclosed in the aforementioned application entitled "Configuration of Connections in a 3D Stack of Integrated Circuits", having U.S. application Ser. No. 13/217,789.

SUMMARY

According to an aspect of the present principles, there is provided a strata manager within a 3D chip stack having two or more strata. The strata manager includes a plurality of scannable configuration registers, each being arranged on a respective one of the two or more strata for storing a set of bits. The set of bits is configured to program an operation of a corresponding one of the two or more strata on which the set of bits is stored or a device thereon.

According to another aspect of the present principles, there is provided a method for programming strata within a 3D chip stack having two or more strata. The method includes providing a plurality of scannable configuration registers. The method further includes arranging each of the plurality of scannable configuration registers on a respective one of the two or more strata for storing a set of bits. The set of bits is configured to program an operation of a corresponding one of the two or more strata on which the set of bits is stored or a device thereon.

According to yet another aspect of the present principles, there is provided a stratum identifier within a 3D chip stack having two or more strata and multiple integrated circuits. The stratum identifier includes a plurality of stratum identification circuits, each arranged on a respective one of the two or more strata, and each having "N" inter-stratum inputs and "N" inter-stratum outputs. N is an integer equal to or greater than 1, and $2^N$ is a number of the two or more strata. The inter-stratum inputs from a respective one of the plurality of stratum identification circuits on each of the two or more strata are connected to and driven by the inter-stratum outputs from a different one of the plurality of stratum identification circuits on an adjacent one of the two or more strata. Inter-stratum input signals and inter-stratum output signals are provided as binary encoded values such that the inter-stratum output signals encode a value of the inter-stratum input signals incremented by 1. The inter-stratum output signals are available to at least some of the multiple integrated circuits on a same one of the two or more strata stratum so as to provide the encoded value therein as a unique binary pattern on each of the two or more strata.

According to still another aspect of the present principles, there is provided a method for identifying individual stratum within a 3D chip stack having two or more strata and multiple integrated circuits. The method includes providing a plurality of stratum identification circuits, each arranged on a respective one of the two or more strata, and each having N inter-stratum inputs and N inter-stratum outputs, N being an integer equal to or greater than 1, and $2^N$ being a number of the two or more strata. The method further includes interconnecting and driving the inter-stratum inputs from a respective one of the plurality of stratum identification circuits on each of the two or more strata to and by the inter-stratum outputs from a different one of the plurality of stratum identification circuits on an adjacent one of the two or more strata. The method also includes providing inter-stratum input signals and inter-stratum output signals as binary encoded values such that the inter-stratum output signals encode a value of the inter-stratum input signals incremented by 1. The method additionally includes providing the inter-stratum output signals to at least some of the multiple integrated circuits on a same one of the two or more strata stratum so as to provide the encoded value there from as a unique binary pattern on each of the two or more strata.

According to a further aspect of the present principles, there is provided a stack-wide scan circuit within a 3D chip stack having two or more strata including a first terminal stratum and a second terminal stratum. The stack-wide scan circuit includes a plurality of configurable scan chains, each including a scannable configuration register. The stack-wide scan circuit further includes an off-stack accessible input port connected in a broadcast configuration to each of the plurality of scan chains. The stack-wide scan circuit also includes an off-stack accessible output port on the first terminal stratum connected to a given one of the plurality of configurable scan chains on the first terminal stratum. The stack-wide scan circuit additionally includes configuration element for configuring the plurality of scan chains to selectively provide any of a plurality of different scan paths through the two or more strata.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to programming the behavior of individual chips or strata in a 3D stack of integrated circuits.

The present principles provide a way of programming the unstacked strata as well as the stack using a small number of I/O and TSV positions to enable test, stratum configuration, and functional differentiation of physically identical strata in a stack.

In accordance with an embodiment of the present principles, a configuration register that includes 1 or more bits is present on each stratum (each chip) of a system that is to be constructed into a 3D IC. The outputs of this register can be used by the stratum to "program" the operation of that individual stratum. Such programming operation could include, but would not be limited to, one or more of the following: determining the source of a clock; determining if off-chip drivers (OCDs) on this stratum will drive; determining if the termination function of an input receiver on this stratum would be active; determining the "address" of a particular stratum (that address may be used to determine which stack input commands would activate a particular function on a particular stratum); determining if a stratum is to be active or dormant; configuring one or more inter-strata scan chains, and determining the power level of inter-strata drivers or off-chip drivers.

Further, in an embodiment, which makes efficient use of TSV space and design resources, the above register would be scannable and arranged so that the register is fed from a pad or other probe-able connection point of an unstacked strata, or a pad/C4 of a stack.

Also, in an embodiment, the register chain is connected between a disjoint TSV set in such a way that a continuous chain is formed in the stack.

Additionally, in an embodiment, a mechanism is provided that allows testing of the stack configuration chain described above, both before and after stacking. This can be done even when all chips in the stack are physically identical.

Figure 1:
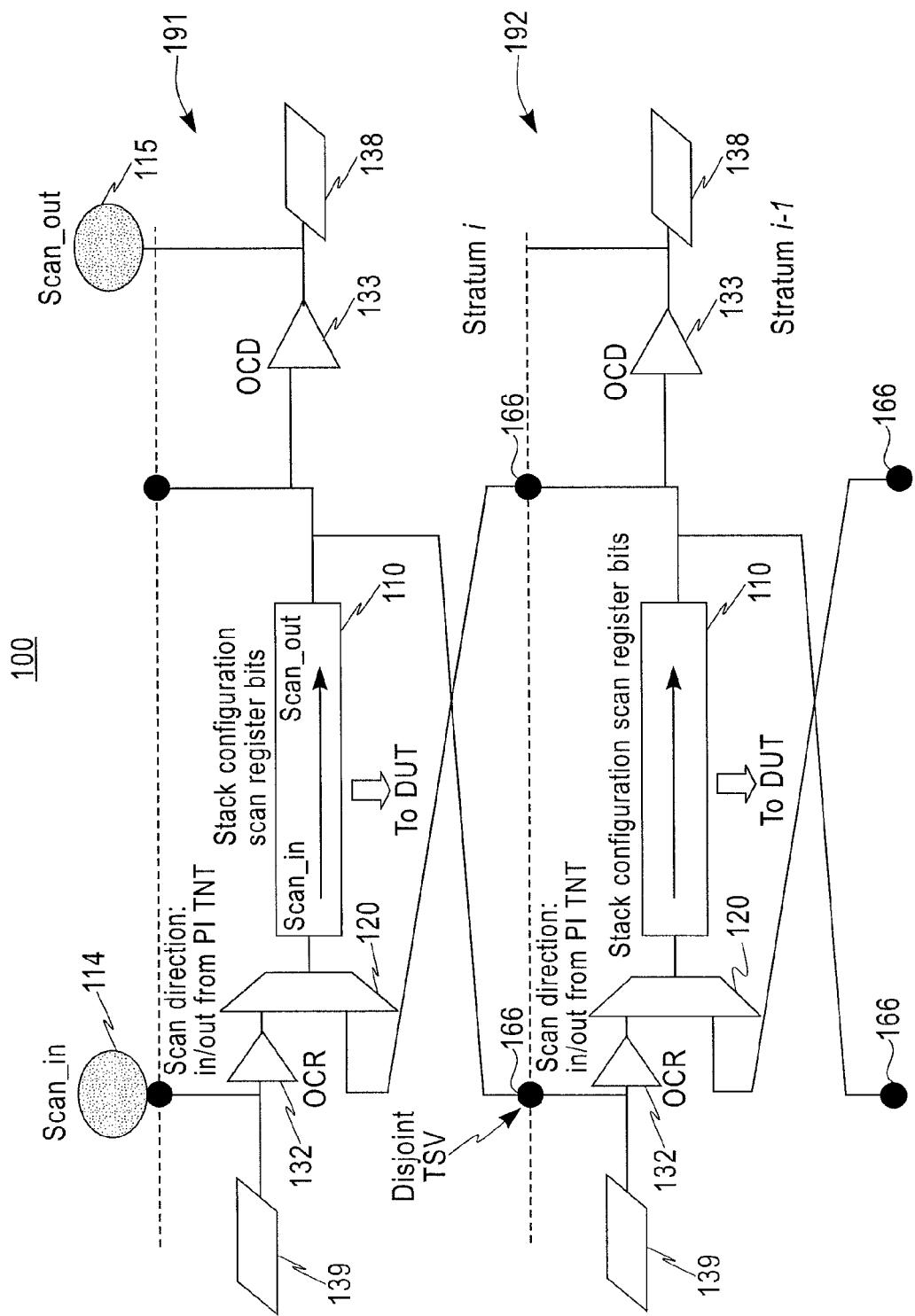
FIG. 1 shows a stack scan configuration 100 for a 3D chip stack 199, in accordance with an embodiment of the present principles.

FIG. 1 shows a stack scan configuration 100 for a 3D chip stack 199, in accordance with an embodiment of the present principles. The chip stack 199 includes two strata (chips), namely a stratum_i 191 and a stratum_i−1 192. While only two strata are shown, for the sake of illustration, we will consider stratum_i 191 to be a terminal stratum, and will also consider stratum_i−1 192 to be a non-terminal stratum. The terminal strata being the first and last, or outer strata in a stack. The first terminal stratum in the stack is also electrically accessible using a probe or a package.

Each stratum includes a scan programmable register 110 that will source the programming and configuration bits for that stratum. The source of the register 110 is a multiplexer 120. That multiplexer 120 is controlled by off-chip signals provided as a broadcast input to every stratum in the stack and has as inputs: (a) an inter-strata I/O circuit (not shown) connected to an inter-strata connector that connects to the scan_out port 115 of the register 110 on the strata below; or (b) an off-chip receiver (OCR) circuit 132 (or OCR 132 in short). An input of the OCR circuit 132 on a terminal stratum is connected to a scan_in port 114.

When the unstacked strata are under test, or when the stratum is a first terminal stratum (e.g., stratum 191), the input pad 139 of the OCR circuit 132 is capable of being connected to a probe by the tester, or connectable to the package and probable by the tester. When the stratum is in a stack, and is not the first terminal stratum (e.g., stratum 192), the OCR circuit 132 is connected to an inter-strata connection point 166 and to the scan_out port 115 of the register 110 on the stratum above (e.g., stratum 191).

The scan_out signal of the register 110 is connected to the input of an off-chip driver (OCD) 133. The output pad 138 of the OCD 133 is probe-able by a tester for an unstacked stratum, or available for probing or package connection to the first terminal stratum in a stack.

By controlling the signals that determine the setting of the multiplexers 120, a stack configuration scan can proceed "forward—into the stack" to load the bits in all of the registers 110. As used herein, the word "forward" or phrase "forward direction", when used with respect to performing a scan or load operation on the stack, refers to commencing from a first terminal stratum and ceasing at a second terminal stratum. The word "reverse" or phrase "reverse direction", when used with respect to performing a scan or load operation on the stack, refers to commencing from the second terminal stratum and ceasing at the first terminal stratum. Thus, for a stack of chips or strata designated A, B, C, and D (with A and D being the outermost strata in the stack), presuming A is the first terminal stratum, a scan in the forward direction commences at stratum A and ceases at stratum D. In contrast, for that same stack with the same presumption that A is the first terminal stratum, a scan in the reverse direction commences at stratum D and ceases at stratum A.

To test the correct operation of a stack configuration scan chain in the stack, one can load the registers 110 in the "forward" direction (i.e., into the stack), then reverse the direction and scan_out the registers 110 in the "reverse" direction, up the stack, and out of the off-chip driver 133 or an off-stack driver to the tester.

An initial scan can be used to set bits that designate, for example, the first terminal stratum, the second terminal stratum, a driving stratum (i.e., a stratum in a stack that is to drive the remaining strata in the stack), and any disabled strata. The initial scan can also encode the strata positions or addresses in the stack.

A special switchable configuration allows primary input (PI) control of the scan direction. In a forward mode, the scan proceeds from the first terminal stratum towards the second terminal stratum. In a reverse mode, the scan proceeds from the second terminal stratum toward the first terminal stratum. This allows the scan chain to be verified before the logical second terminal stratum is identified.

The registers 110 may be controlled by separate non-overlapping A-phase and B-phase scan clocks (not shown), each provided separately as broadcast inputs to the stack. Such a configuration can provide a more robust scan operation in the presence of technology, process, or other variations between different strata in the stack.

We note that multiplexer control and scan register clocking is not explicitly shown in FIG. 1. However, given the teachings of the present principles provided herein, one of ordinary skill in this and related arts can readily appreciate that each of these signals can be provided by broadcast input type inter-strata connections. That is, all multiplexers 120 in the stack can be controlled by the same primary input to the stack. Also, all registers 110 can be clocked by the same signal or signals, as provided by the stack primary inputs. All of these signals can be buffered on each stratum, as long as sufficient timing margin is provided, as is evident to one of ordinary skill in this and related arts.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It is to be further appreciated that while one or more embodiments described herein may refer to the use of Silicon with respect to a chip or a through via, the present principles are not limited to using only chips or vias made from Silicon and, thus, chips or vias made from other materials including but not limited to Germanium and Gallium Arsenide may also be used in accordance with the present principles while maintaining the spirit of the present principles. Moreover, it is to be further appreciated that while one or more embodiments described herein may refer to the use of C4 or micro C4 (uC4) connections, the present principles are not limited to solely using C4 or micro C4 connections and, thus, other types of connections may also be used while maintaining the spirit of the present principles.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
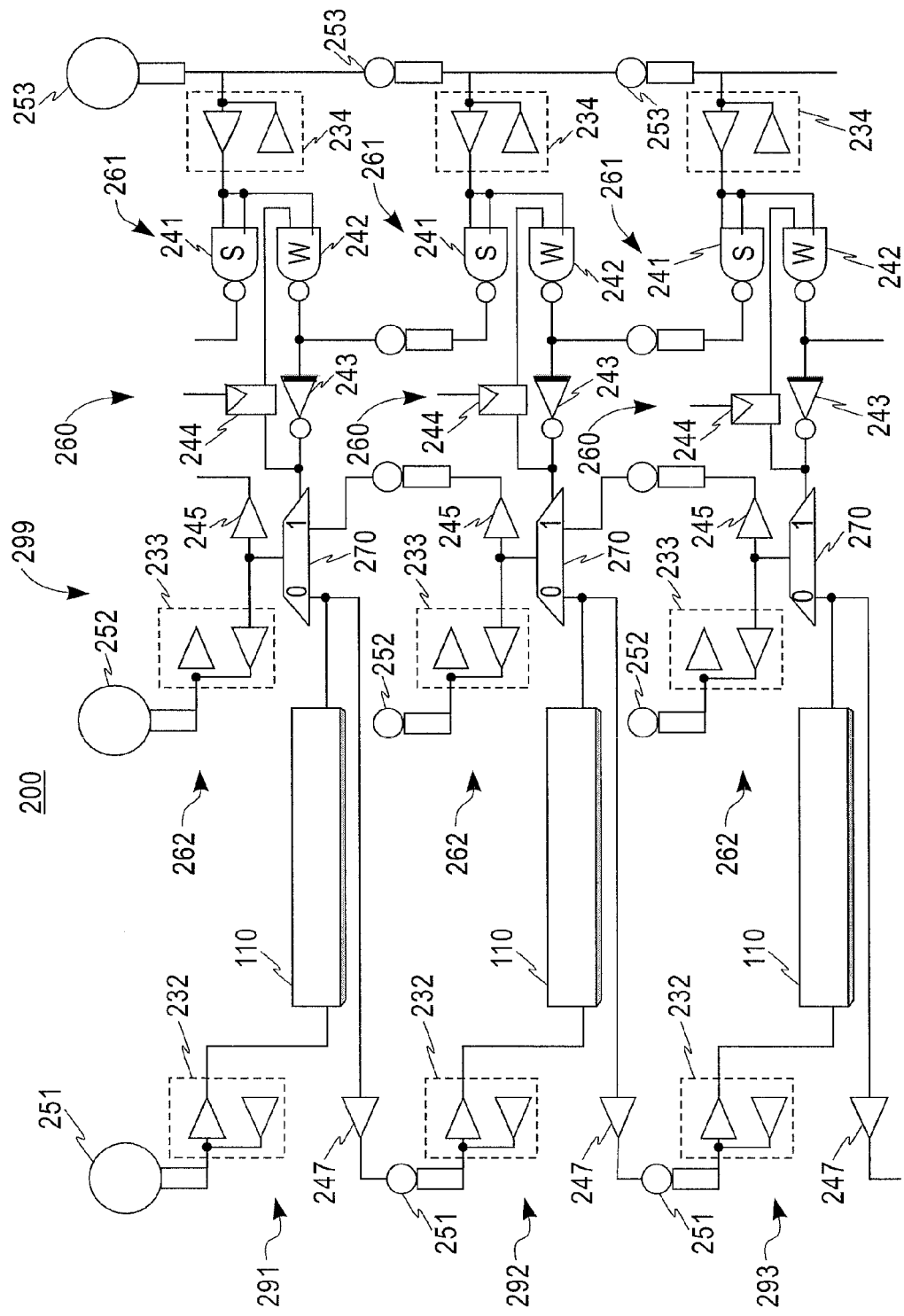
FIG. 2 shows another stack scan configuration 200 for a 3D chip stack 299, in accordance with an embodiment of the present principles.

Referring to FIG. 2, another stack scan configuration 200 for a 3D stack of integrated circuits 299 is shown, in accordance with an embodiment of the present principles. The chip stack 299 includes three strata (chips), namely 291, 292, and 293. It is to be appreciated that stack 299 includes three strata for illustrative purposes and, hence, any number of strata equal to or greater than 2 may also be used, while maintaining the spirit of the present principles. The stack scan configuration 200 includes a scannable stack configuration register 110 on each stratum. However, in the stack scan configuration 200 as compared to the stack scan configuration 100 of FIG. 1, the multiplexor 120 at the input to the register 110 in stack configuration 100 is omitted from stack scan configuration 200. For each stratum, the output of the off-chip receiver 232 is connected to a corresponding "scan_in" primary inputs/output (PIO) 251. In this way, a stack scan will be configured to only scan "forward—into the stack". We note that the stack scan configuration circuit portion on each stratum is labeled using the figure reference numeral 262, which includes elements 233 through 270 on each stratum.

Figure 3:
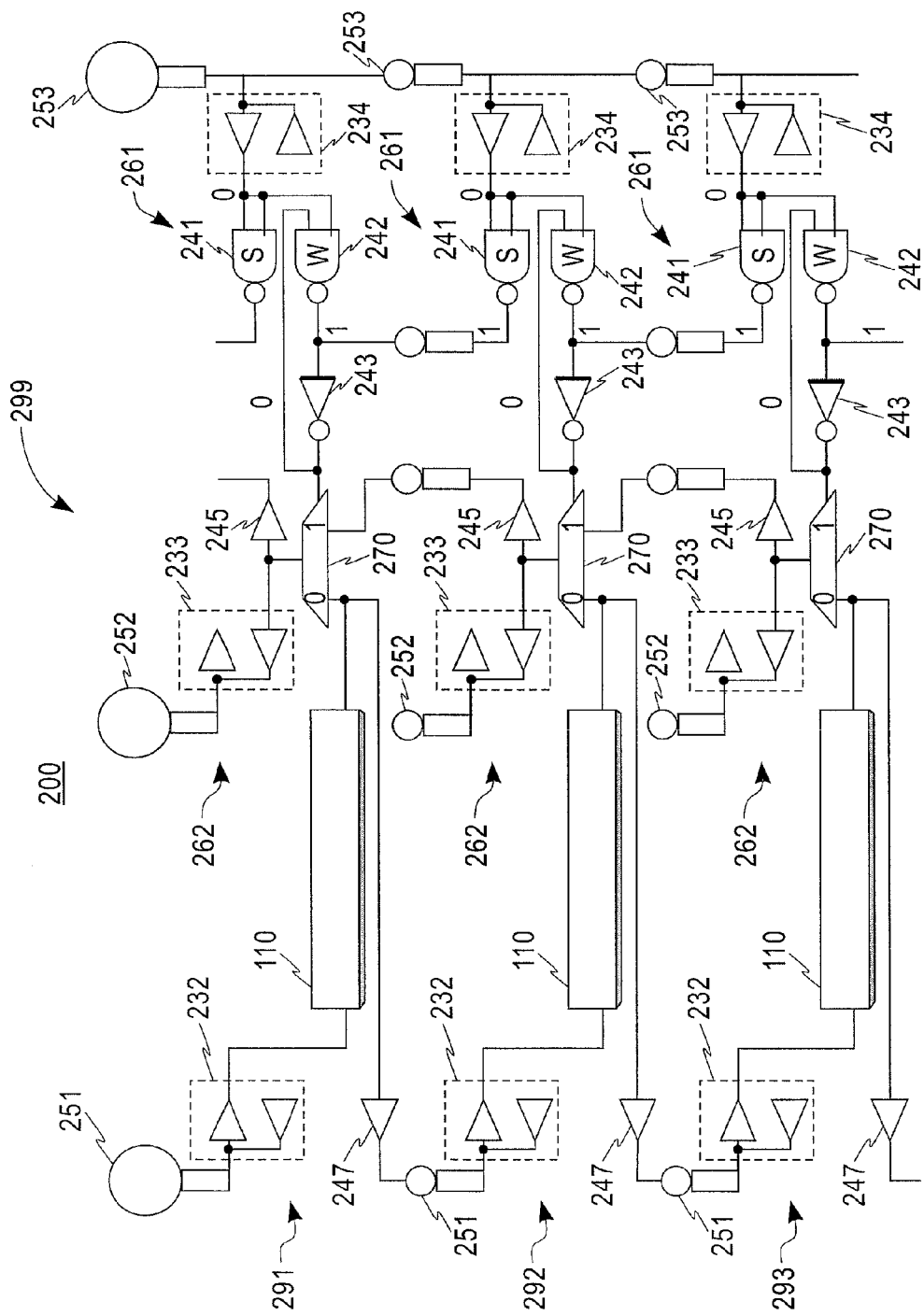
FIG. 3 further shows the stack scan configuration 200 of FIG. 2 with a 0 bit used as a configuration bit, in accordance with an embodiment of the present principles.
Figure 4:
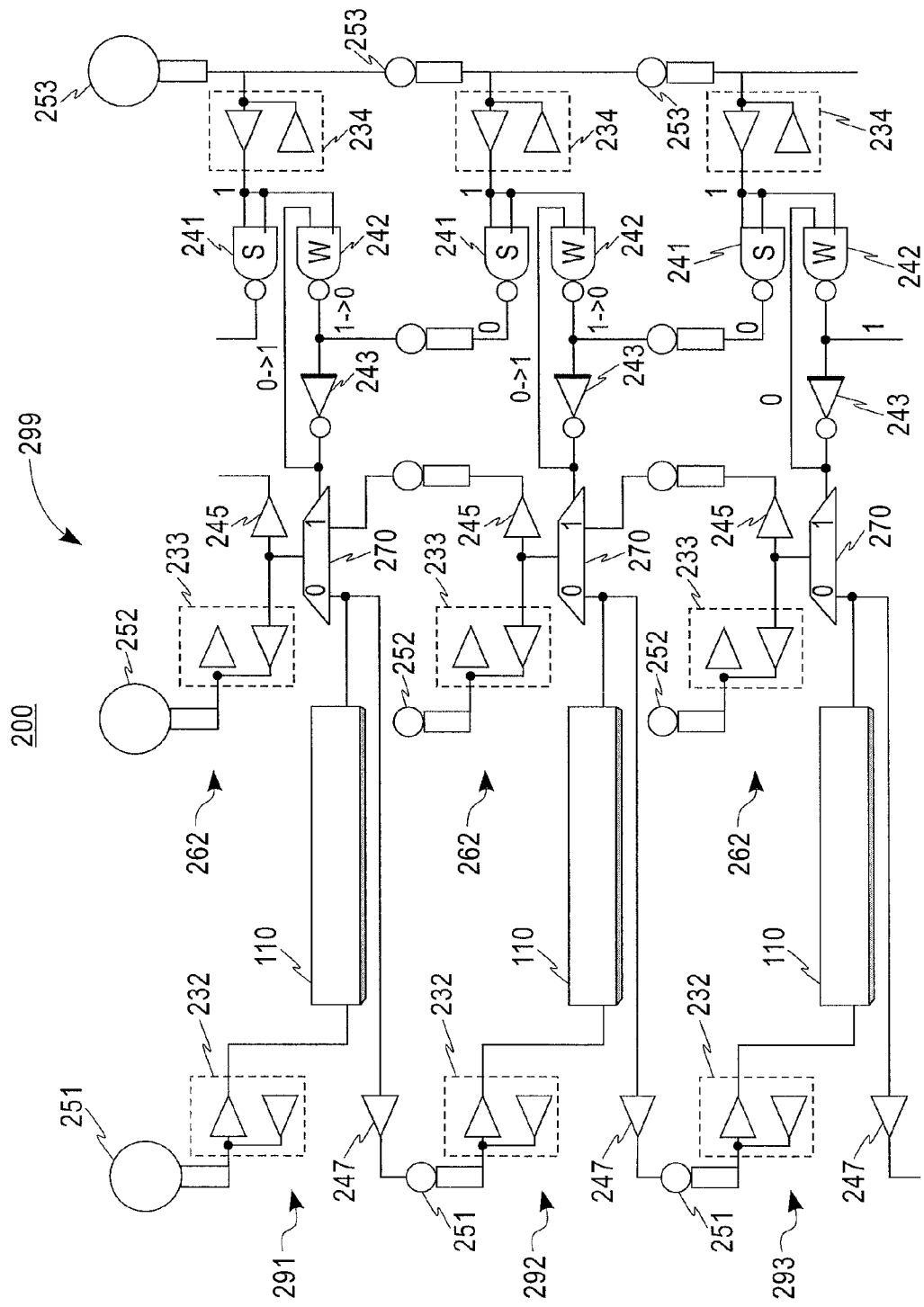
FIG. 4 further shows the stack scan configuration 200 of FIG. 2 with a 1 bit used as a configuration bit, in accordance with another embodiment of the present principles.

To enable the testing of these registers 110, a "stratum 0 detection" circuit 261 is provided on each stratum. Stratum 0 is another name for the second terminal stratum. Each circuit 261 includes a strong NAND gate 241, a weak NAND gate 242, an inverter 243, a clocked latch 244, and a buffer 245. The strong NAND and weak NAND are designed such that when their outputs are connected together, the output of the strong NAND is dominant and determines the digital signal value on the shared output node. The clocked latch 244 is an optional element that may be needed in some design methodologies. It may be omitted as shown in FIGS. 3 and 4. By operating the stack circuitry in such a way that, in sequence; a) as shown in FIG. 3, the configure signal 253 is held to logic LO while the self-configure clock 260 is pulsed then b) as shown in FIG. 4 the configure signal 253 is held to logic HI while the self-configure clock 260 is pulsed, then c) holding the self-configure clock off and the configure signal HI, each circuit 260 detects the presence or absence of a stratum "below" itself and sets a digital output bit, the output of inverter 243 appropriately responsive to the detection. In the case where the latch 244 is not included, then the self-configure clock pulse is not needed. These signals, the outputs of inverters 243 can then be used to control a 3D selector circuit 270 to choose the stratum 0 (or second terminal stratum) input to the 3D multiplexor 270 to be the output of the multiplexor 270, which is broadcast to every stratum. The output of the multiplexor 270 is driven off-chip or off-stack by an OCD 233. The OCD 233 is connected to a respective scan_out PIO 252. A configure port 253 is connected to a receiver 234. A respective buffer 247 is connected in between one input of the multiplexer 270 and the "scan_in" 251.

With the circuit described here, once the stratum 0 detection circuit has been exercised, the stack configuration scan chain may be tested by scanning a particular pattern through the entire chain, and detecting the pattern of the bits that emerge.

The 3D chip stack 299 also includes test probe points (not shown) on each strata connected to the input of the receiver circuit 232 and to the output of the driver circuit 252. These test probes are accessible to operate the configuration register's scan ports when the respective stratum is being tested before assembly into the stack 299.

FIG. 3 further shows the stack scan configuration 200 of FIG. 2 with a 0 bit used as a configuration bit, in accordance with an embodiment of the present principles. However, we note that the clocked latch 244 is omitted in FIG. 3 for the sake of simplicity, but may be included in other embodiments. FIG. 3 shows that a 0 bit applied to the configure port 253 provide a conflict-free state and resets every latch (i.e., every latch formed by NAND gate 241) on each of the strata.

FIG. 4 further shows the stack scan configuration 200 of FIG. 2 with a 1 bit used as a configuration bit, in accordance with another embodiment of the present principles. However, we note that the clocked latch 244 is omitted in FIG. 4 for the sake of simplicity, but may be included in other embodiments. FIG. 4 shows that a 1 bit applied to the configure port 253 flips every latch (formed by NAND gate 241) except in the second terminal stratum, stratum 0.

Alternately, a circuit similar to the "stratum 0 detection" 260 can be used to detect if a stratum is a second terminal stratum. Only if the stratum is a second terminal stratum would its OCD be active during a stack configuration scan. Such a similar circuit is readily implementable by one of ordinary skill in the art, given the teachings of the present principles provided herein.

Alternately, a circuit similar to the "stratum 0 detection" 260 can be used to detect if a stratum is a first terminal stratum. Only if the stratum is a first terminal stratum would its OCD be active during the stacks functional or test operation to drive signals off the stack. Such a similar circuit is readily implementable by one of ordinary skill in the art, given the teachings of the present principles provided herein.

In a third variation of the present principles, a set of identical circuits are placed on each stratum, connected to other strata with disjoint TSV connections. This circuit detects the "position" of the strata in the stack, providing a multi-bit digital output that is unique on each stratum. This digital code can be used for any purpose, including programming the operation of the strata.

Figure 5:
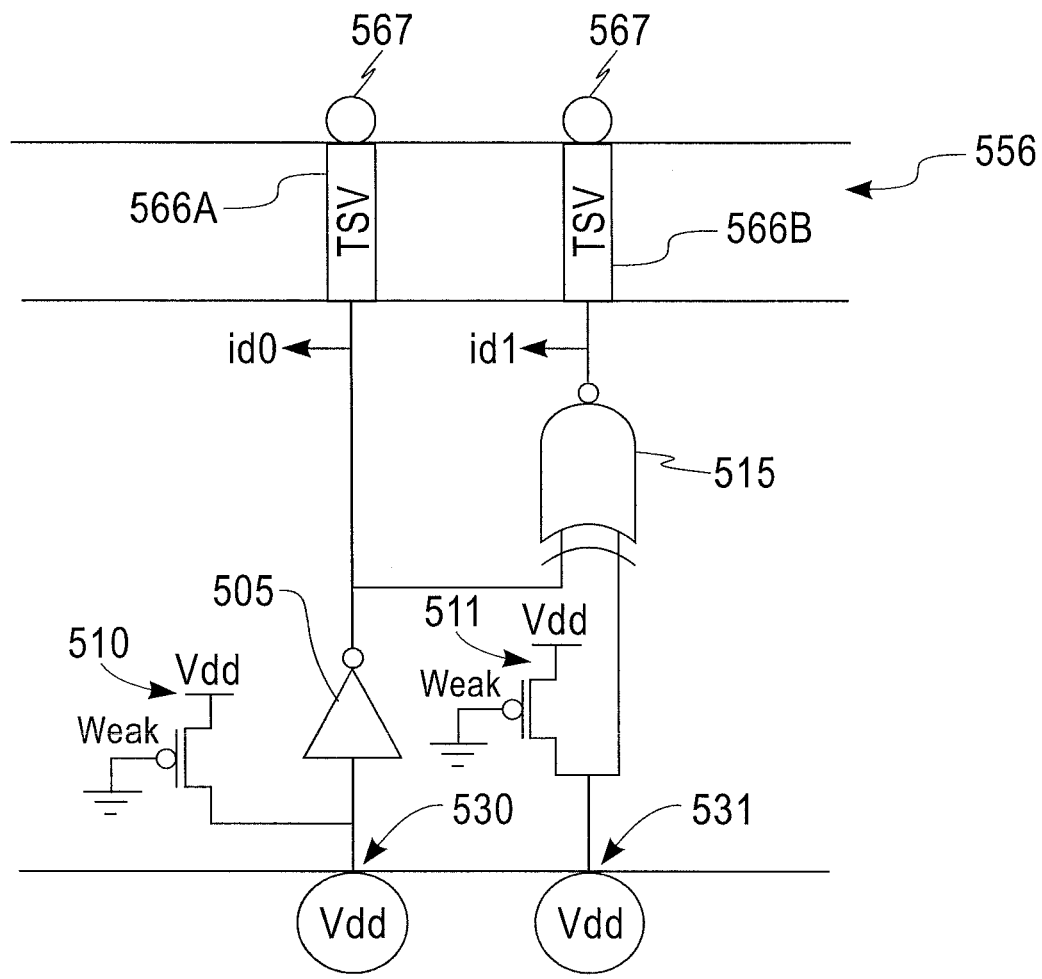
FIG. 5 shows a stratum identifier (ID) circuit 500, in accordance with an embodiment of the present principles.
Figure 6:
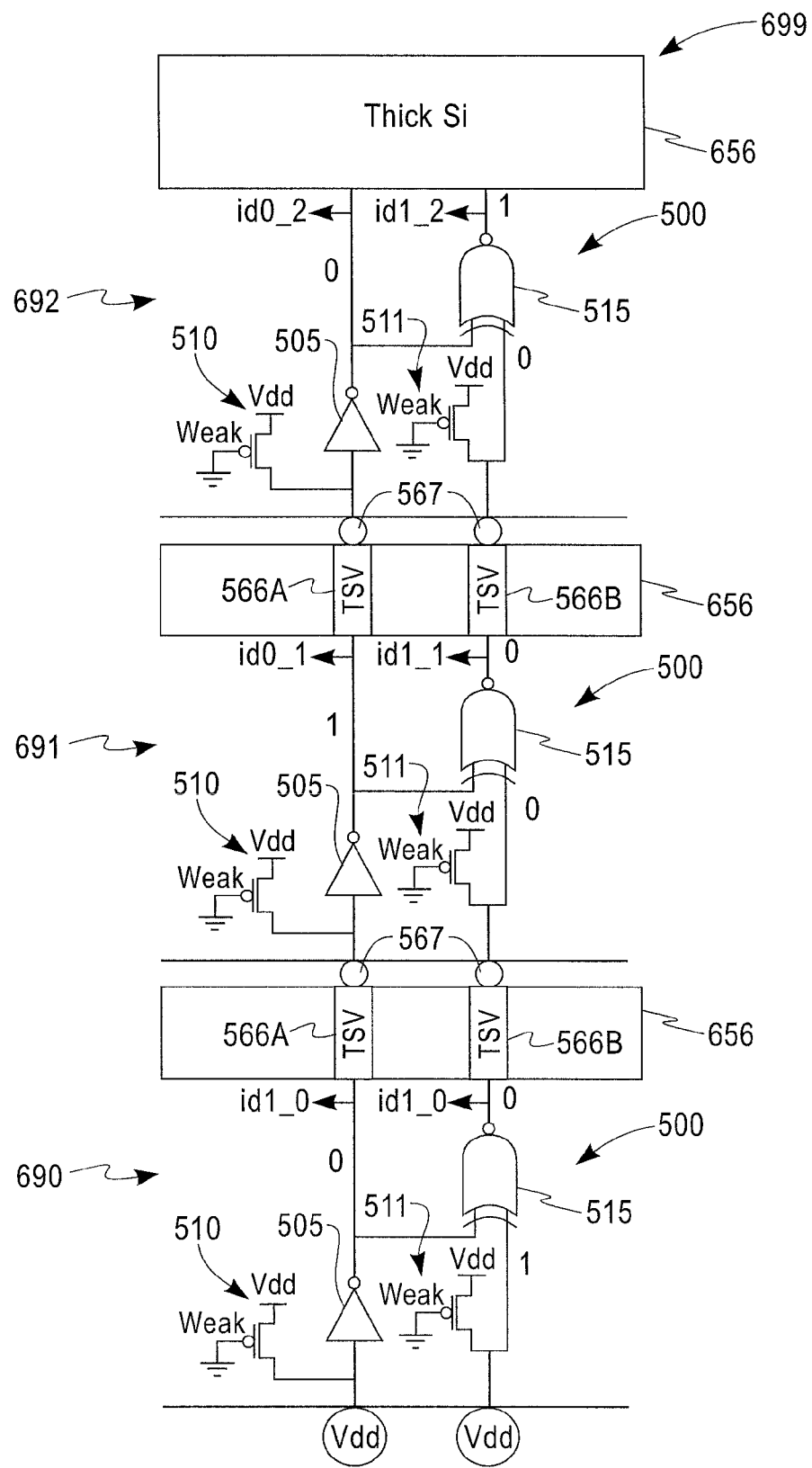
FIG. 6 shows the stratum identifier (ID) circuit 500 of FIG. 5 used in each stratum of a 3D chip stack 699, in accordance with an embodiment of the present principles.

FIG. 5 shows a stratum identifier (ID) circuit 500, in accordance with an embodiment of the present principles. The stratum ID circuit is preferably for use in a 3D stack of integrated circuits, as shown in FIG. 6 described hereinafter.

The stratum ID circuit 500 includes an inverter 505 having an input connected to a front-side connection 530 voltage Vdd and a drain of a p-channel MOSFET 510. A gate of the p-channel MOSFET 510 is connected to ground. A source of the weak p-channel MOSFET 510 is connected to the power rail, VDD.

A gate of a weak p-channel MOSFET 511 is connected to ground. A source of the p-channel MOSFET 511 is connected to the power rail, VDD. A drain of the p-channel MOSFET 511 is connected to a front-side connection 531 and to a first input of an EXCLUSIVE NOR gate 515.

An output of the inverter 505 is connected to a second input of the EXCLUSIVE NOR gate 515 and to a TSV 566A, providing a unique id0. The output of the EXCLUSIVE NOR gate 515 is connected to another TSV 566B, providing a unique id1. The TSV 566A and TSV 566B traverse a Silicon portion 556. C4 567 connections can also be used. When connected in a stack, the front-side connections 530, 531 on the first terminal stratum will both be connected to VDD.

Thus, as shown in FIG. 5, the layer ID circuit 500 uses a weak PMOS pull-up to ensure no floating gate inputs. The unique IDs (id0 and id1) are unique for the layers. Before stacking, the unique IDs for each stratum are always equal to (0, 0).

FIG. 6 shows the layer identifier (ID) circuit 500 of FIG. 5 used in each stratum of a 3D chip stack 699, in accordance with an embodiment of the present principles. The chip stack 699 includes 3 strata, namely stratum 690, stratum 691, and stratum 692 for illustrative purposes.

After stacking and applying the correct voltage levels to the 2 inputs, each stratum will have a unique (id1, id0). In an embodiment, the first terminal stratum (690) will have a unique ID of (0,0), the next adjacent stratum (691) will have a unique ID of (0,1), the next adjacent stratum (692) will have a unique ID of (1,0), and so on up to 4 layers with the last stratum having a unique ID of (1,1). Of course, given the teachings of the present principles provided herein, one of ordinary skill in the art will readily recognize that the preceding approach can be expanded to include more bits for more strata (i.e., greater than 4) in a stack. The circuits 500 are connected together through the various Silicon portions 656 using TSVs 566A and 566B and also using C4s 567 or other means to create inter-strata connections.

Figure 7:
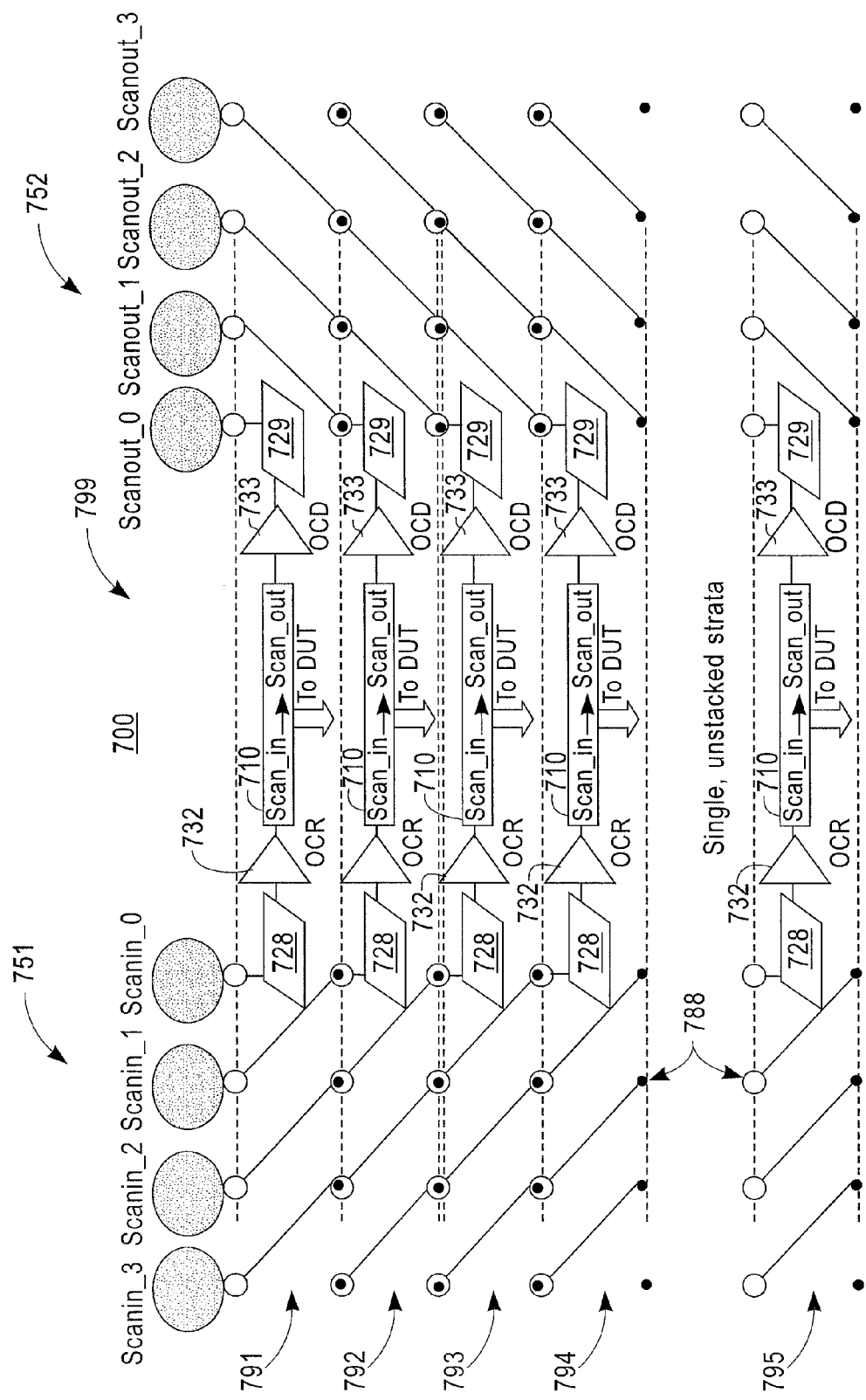
FIG. 7 shows yet another stack scan configuration 700 for a 3D chip stack 799, in accordance with an embodiment of the present principles.

FIG. 7 shows yet another stack scan configuration 700 for a 3D chip stack 799, in accordance with an embodiment of the present principles. The chip stack 799 includes four strata 791, 792, 793, and 794 for illustrative purposes. Each of the strata includes a respective configuration register 710 connected to an off-chip receiver (OCR) circuit 732 (or OCR 732 in short) and an off-chip driver (OCD) 733. Each OCR 732 is attached to an input pad 728, and each OCD 733 is attached to an output pad 729.

The stack configuration 700 uses inclined TSV inter-strata connections 788 to provide stack PIO access to each stratum individually. That is, each stratum is connected to a respective scan_in port 751 and a respective scan_out port 752. The input pad 728 of the OCR circuit 732 is connected to a respective scan_in port 751. The output pad 729 of the OCD 733 is connected to a respective scan_out port 752.

This configuration 700 requires more TSV positions and more I/O positions, but is slightly easier to control. A hybrid mix could be used whereby only the outputs of the scan registers 710 are connected to include TSV connection configurations and the inputs are connected to the scan-outs of the preceding strata.

FIG. 7 also shows a single, unstacked stratum 795, in accordance with an embodiment of the present principles. The single, unstacked stratum 795 shows the state of a stratum before connecting that stratum 795 to a stack such as stack 799 using the inclined TSV inter-strata connections 788.

Thus, the inventions described with respect to FIGS. 1 through 7 relate to ways of loading a special "configuration register" that can be used to program certain characteristics of the strata in a 3D stack. Of many possible characteristics as readily contemplated by one of ordinary skill in this and related arts, one of the characteristics could be the configuration of the stack-wide general purpose scan chain. This stack-wide general purpose scan chain would be used to access all of the scannable registers on all of the strata in the stack. The configuration of this stack-wide chain is programmed using signals labeled P1-P12 in FIG. 8 described below. The source of the signals P1-P12 would be the stack configuration registers described in FIG. 1-7.

Figure 8:
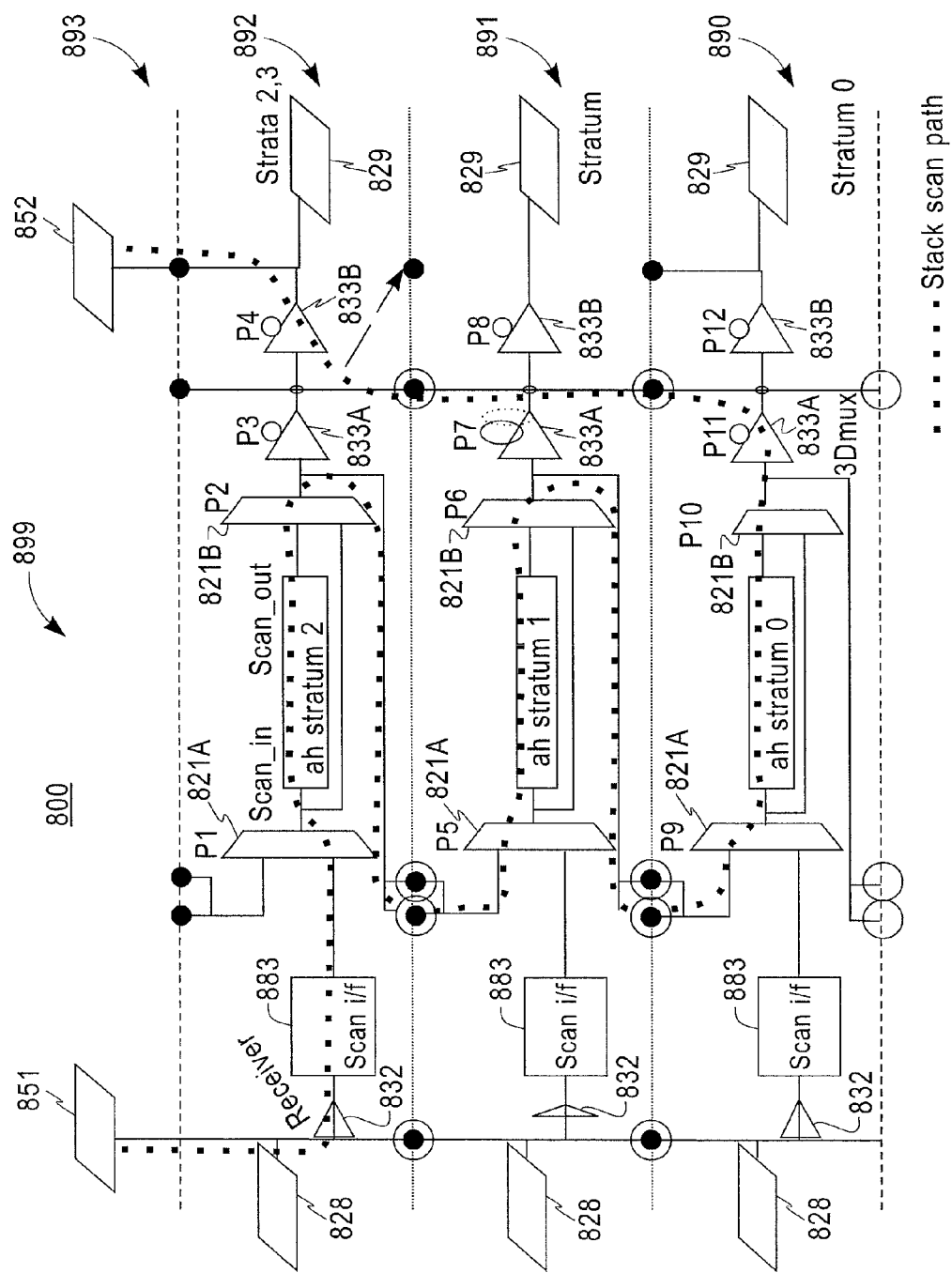
FIG. 8 shows a stack-wide scan circuit 800 for a 3D chip stack 899, in accordance with an embodiment of the present principles.

FIG. 8 shows a stack-wide scan circuit 800 for a 3D chip stack 899, in accordance with an embodiment of the present principles. The stack configuration 800 pertains to a stack-wide scan chain configuration. That is, FIG. 8 describes a stack-wide scan circuit that has special features and functionality for 3D stacked ICs. Circuit 800 provides a means for accessing the scan chain, once the strata are configured, both before and after the strata are constructed into a stack. Circuit 800 also provides a means for customizing the scan path once the stack has been formed to enable a variety of configurations of the chains including, but not limited to: serial access to all chains in a daisy chained configuration; serial access to a selected subset of chains in a daisy chain fashion; and broadcast access to a selected subset of the chains in a common input fashion. A way to direct the output of the chain to either off-stratum or off-stack OCDs is also provided.

The chip stack 899 includes a stratum_0 890, a stratum_1 891, a stratum_2 892. Stratum-2, the first terminal stratum, also includes off-stack connection elements 893. Each stratum includes an off-chip receiver (OCR) circuit 832 (or OCR 832 in short) and an off-chip driver (OCDs) 833B. Each OCR 832 is attached to an input pad 828, and each OCD 833B is attached to an output pad 829. Each stratum also includes elements 833A which provide the functionality of a 3D selector. In FIG. 8, the 3D selector is realized using a set of tri-state drivers 833A, where the enable function of the tri-state driver is sourced by a bit from the stack configuration register (P3, P7, P11) to determine which stratum will have its 3D selector inputs broadcast to all strata on the stack. Other circuits may be used for this 3D selector function.

The stack configuration uses through-and-through (TNT) TSV inter-strata connections 788 to provide stack access to the strata. That is, all of the strata are connected in a broadcast configuration to an input port 851 and one stratum 892, is connected to output port 852. The input pad 828 of the OCR circuit 832 is connected to input port 851. The output pad 829 of the OCD 833 is connected to output port 852. On each stratum, a scan interface circuit 883 is optionally located in between the OCR 832 and the multiplexer 821A. The scan interface circuit may be used to condition the scan signals. As noted above, in FIG. 8, Px (spanning P1 through P12) denotes a stack configuration scan bit program setting that are sourced by bits from the stratum management circuit register 110. We note that the through-and-through TSVs are disclosed in the aforementioned application entitled "Configuration of Connections in a 3D Stack of Integrated Circuits"Ser. No. 13/217, 789.

It is common that integrated circuit chips have one or more scan chains that are used to load and unload latches on the chip. Stack-wide scan circuit 800 can operate along with stack scan configuration 100 in FIG. 1 to configure the set of scan chains present on individual strata of a 3D stacked IC so that these scan chains are accessible from the primary I/Os of the stack when the stack is built while also being accessible when the unstacked strata is under test. As noted above, stack scan configuration 100 uses stack configuration register bits as inputs to program the operation of scan chain multiplexers (muxes) 821A and 821B. These muxes 821A and 821B allow a scan chain on one or more of the strata in a stack to be chained together into a "stack-wide series" connection thus providing serial accesses to all scan chains. Stack scan configuration 100 also allows for a "stack-wide broadcast" of scan inputs for operations that may involve common initialization of multiple strata.

Figure 9:
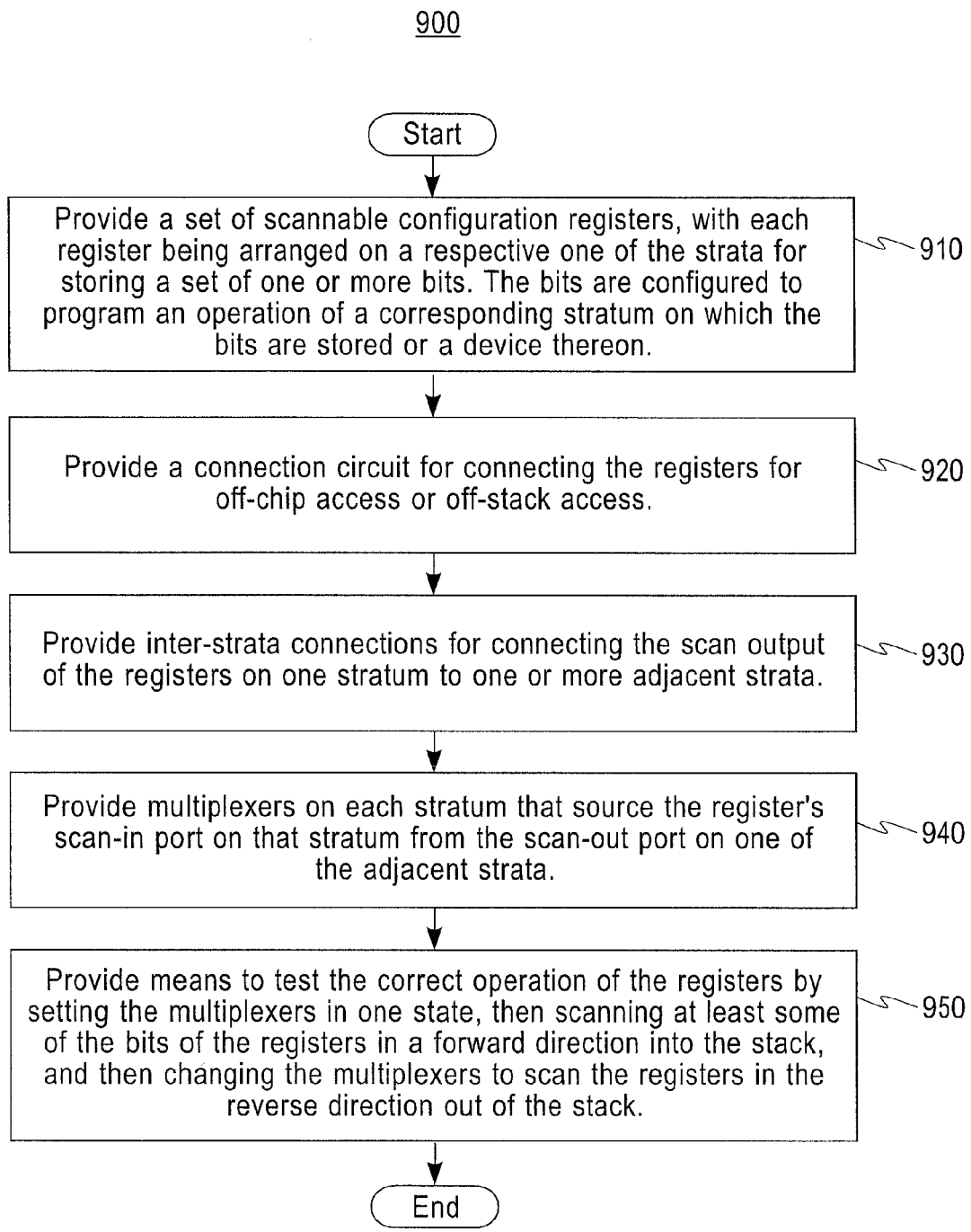
FIG. 9 shows a method 900 for programming strata within a 3D chip stack that includes two or more strata, in accordance with an embodiment of the present principles.

FIG. 9 shows a method 900 for programming strata within a 3D chip stack that includes two or more strata, in accordance with an embodiment of the present principles. At step 910, a set of scannable configuration registers is provided with each register being arranged on a respective one or more of the strata for storing one or more bits, the bits are configured to program an operation of the stratum or a device thereon. At step 920, a connection circuit is provided for connecting the registers for off-chip access or off-stack access. At step 930, inter-strata connections are provided for connecting the scan output of the registers on one stratum to one or more adjacent strata. At step 940, multiplexers are provided on each stratum that source the register's scan-in port on that stratum from the scan-out port on one of the two adjacent strata. At step 950, means to test the correct operation of the registers is provided by setting the multiplexers in one state, then scanning at least some of the bits of the registers in a forward direction into the stack, and then changing the multiplexors to scan the registers in the reverse direction out of the stack.

Figure 10:
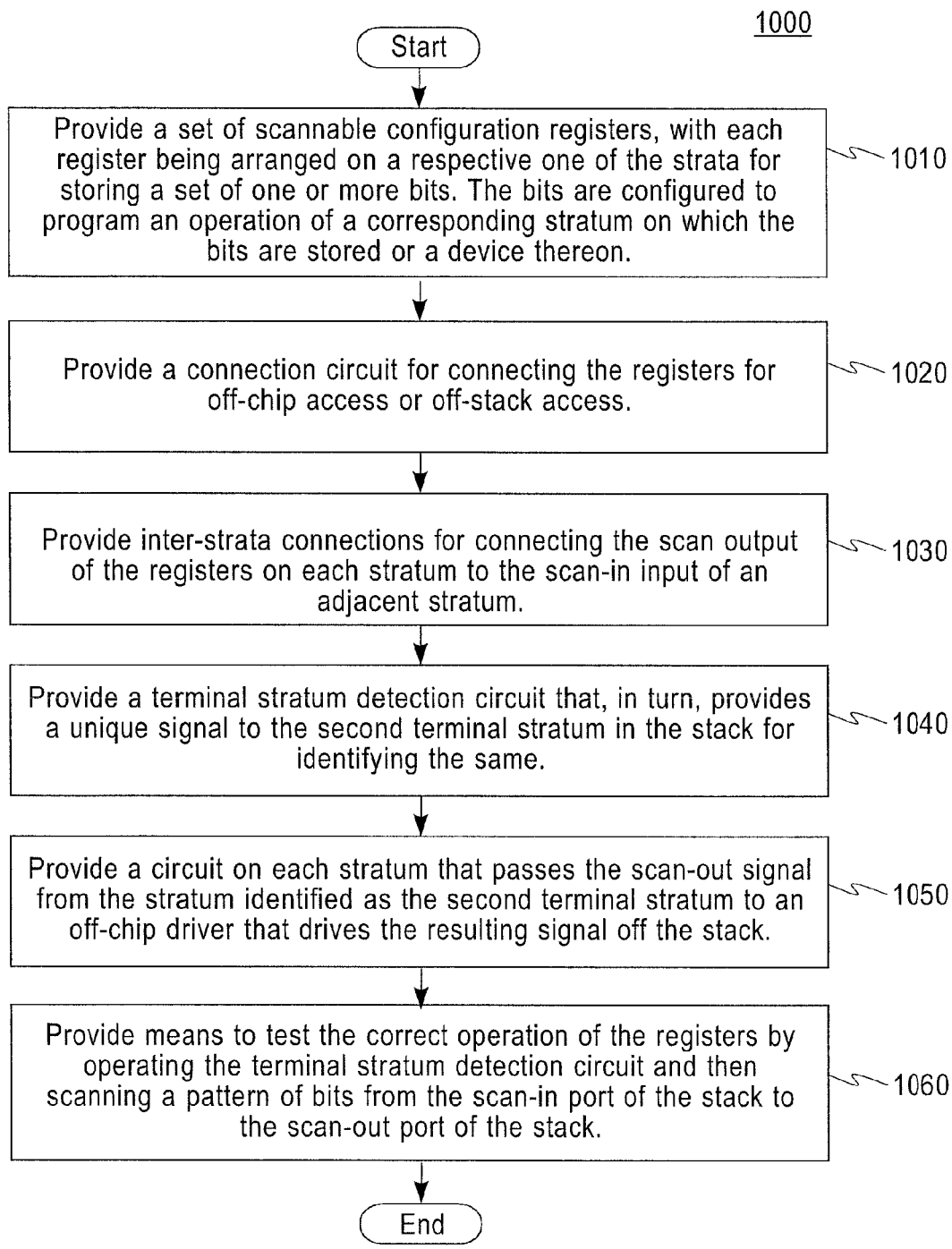
FIG. 10 shows another method 1000 for programming strata within a 3D chip stacking that includes two or more strata, in accordance with an embodiment of the present principles.

FIG. 10 shows another method 1000 for programming strata within a 3D chip stack that includes two or more strata, in accordance with an embodiment of the present principles. At step 1010, a set of scannable configuration registers is provided with each register being arranged on a respective one or more of the strata for storing one or more bits, the bits are configured to program an operation of the stratum or a device thereon.

At step 1020, a connection circuit is provided for connecting the registers for off-chip access of off-stack access. At step 1030, inter-strata interconnections are provided for connecting the scan output of the registers on each stratum to the scan-in input of the adjacent stratum. At step 1040, a terminal stratum detection circuit is provided that, in turn, provides a unique signal to the second terminal stratum in the stack for identifying the same. At step 1050, a circuit is provided on each stratum that passes the scan-out signal from the stratum identified as the second terminal stratum to an off-chip driver that drives the resulting signal off the stack. At step 1060, means to test the correct operation of the registers is provided by operating the terminal stratum detection circuit and then scanning a pattern of bits from the scan-in port of the stack to the scan-out port of the stack.

Figure 11:
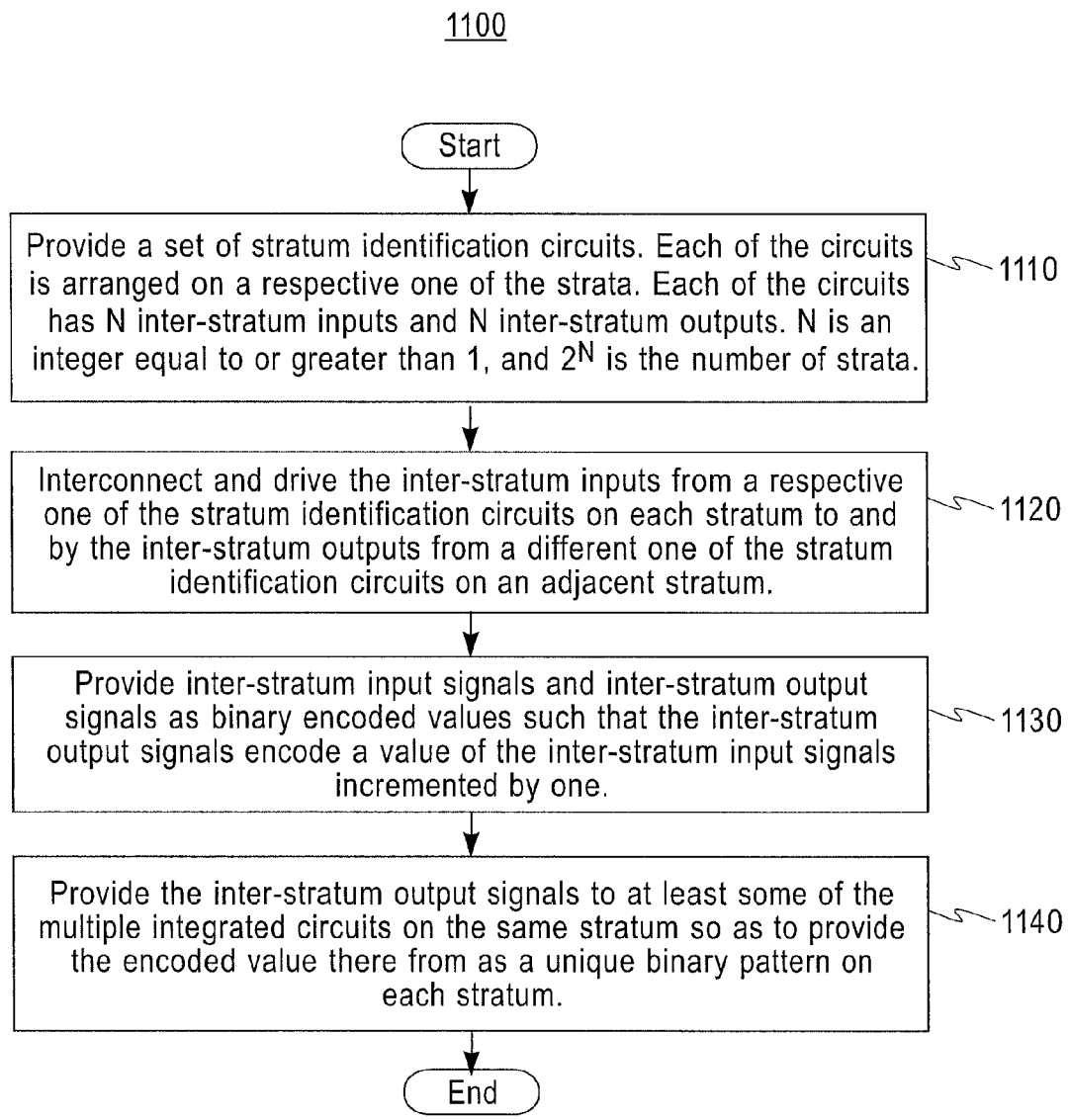
FIG. 11 shows a method 1100 for identifying individual stratum within a 3D chip stack having two or more strata and multiple integrated circuits, in accordance with an embodiment of the present principles.

FIG. 11 shows a method 1100 for identifying individual stratum within a 3D chip stack having two or more strata and multiple integrated circuits, in accordance with an embodiment of the present principles. At step 1110, a set of stratum identification circuits is provided. Each of the circuits is arranged on a respective one of the two or more strata. Each of the circuits has N inter-stratum inputs and N inter-stratum outputs. "N" is an integer equal to or greater than 1, and $2^N$ is the number of the two or more strata. At step 1120, the inter-stratum inputs from a respective one of the stratum identification circuits on each stratum are interconnected and driven by the inter-stratum outputs from a different one of the stratum identification circuits on an adjacent stratum. At step 1130, inter-stratum input signals and inter-stratum output signals are provided as binary encoded values such that the inter-stratum output signals encode a value of the inter-stratum input signals incremented by 1. At step 1140, the inter-stratum output signals are provided to at least some of the multiple integrated circuits on the same stratum so as to provide the encoded value there from as a unique binary pattern on each stratum.

Figure 12:
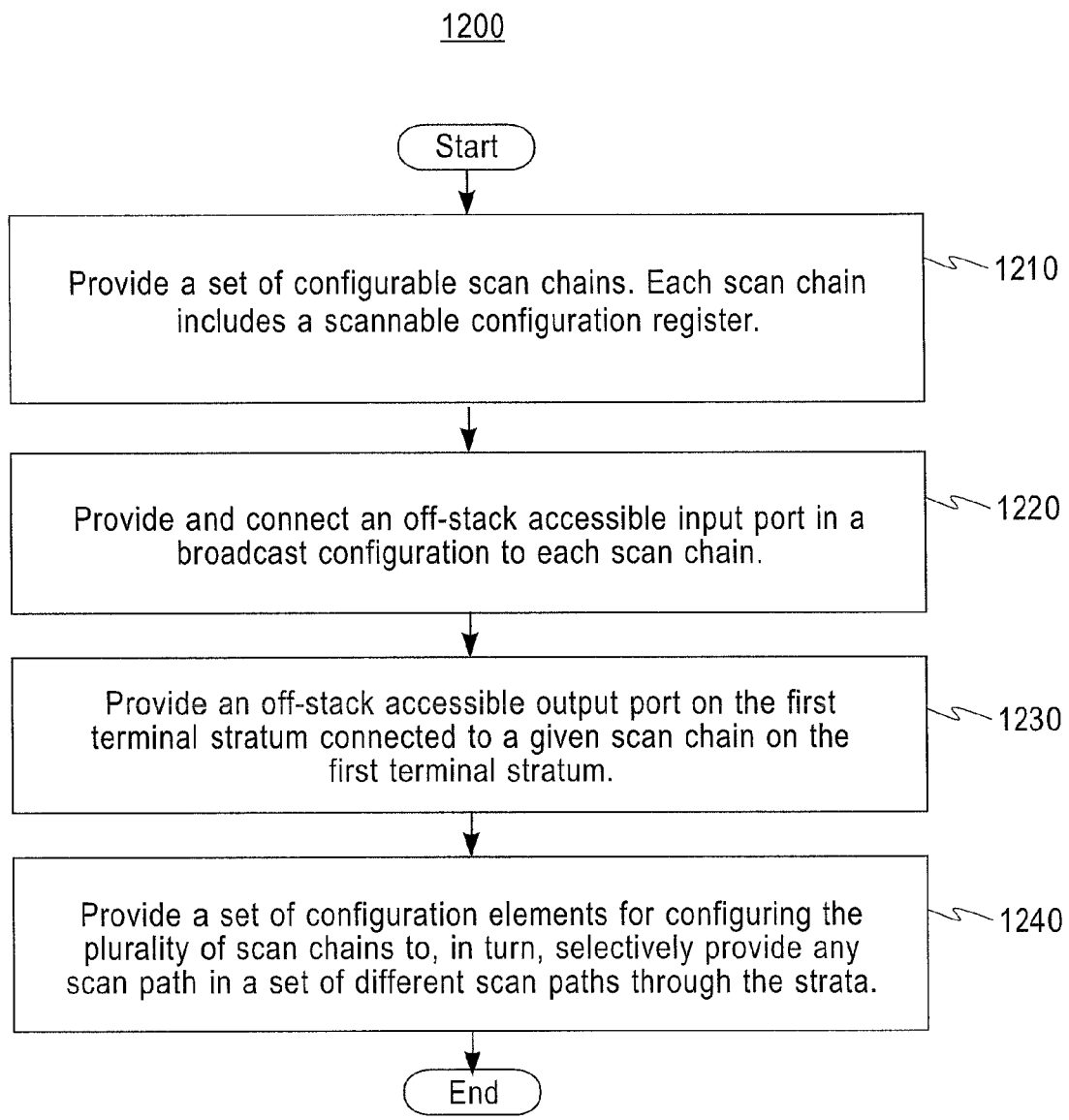
FIG. 12 shows a method 1200 for a stack-wide scan configuration within a 3D chip stack having two or more strata including a first terminal stratum and a second terminal stratum, in accordance with an embodiment of the present principles.

FIG. 12 shows a method 1200 for a stack-wide scan synchronization within a 3D chip stack having two or more strata including a first terminal stratum and a second terminal stratum, in accordance with an embodiment of the present principles.

At step 1210, a set of configurable scan chains is provided. Each scan chain includes a scannable configuration register. At step 1220, an off-stack accessible input port is provided and connected in a broadcast configuration to each scan chain. At step 1230, an off-stack accessible output port is provided on the first terminal stratum connected to a given one of the scan chains on the first terminal stratum. At step 1240, a set of configuration elements for configuring the plurality of scan chains are provided to, in turn, selectively provide any scan path in a set of different scan paths through the strata.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A strata manager within a 3D chip stack having two or more strata, the strata manager comprising:
   a plurality of scannable configuration registers, each being arranged on a respective one of the two or more strata of the 3D chip stack for storing a set of bits,
   wherein the set of bits is configured to program an operation of a corresponding one of the two or more strata on which the set of bits is stored or a device thereon.

2. The strata manager of claim 1, wherein each of the plurality of scannable configuration registers is connected together such that scan ports of the configuration register on each one of the two or more strata are connected in a selectable manner to the scan ports of the configuration registers on each adjacent one of the two or more strata in the stack to allow scan loading the scannable configuration registers in a forward direction into the stack and unloading the scannable configuration registers in a reverse direction out of the stack, the forward direction commencing from a first terminal stratum and ceasing at a second terminal stratum, and the reverse direction commencing from the second terminal stratum and ceasing at the first terminal stratum.

3. The strata manager of claim 2, wherein the stack comprises inter-strata connections for connecting the plurality of scannable configuration registers together in a daisy chain configuration such that a scan of the plurality of scannable configuration registers always proceeds in a forward direction into the stack.

4. The strata manager of claim 3, further comprising a terminal stratum identification circuit for identifying a terminal stratum amongst the two or more strata.

5. The strata manager of claim 4, wherein the daisy chain configuration provides a respective output on each of the two or more strata, and the strata manager further comprises a stratum selector circuit having inputs, selection controls, and outputs on each of the two or more strata, the inputs of the stratum selector circuit being respectively connected to the respective output of the daisy chain configuration on each of the two or more strata, the selection controls being connected to an output of the terminal stratum identification circuit.

6. The strata manager of claim 5, further comprising, on each of the two or more strata, an off-chip driver having an input connected to a respective one of the outputs of the stratum selector circuit on a same one of the two or more strata.

7. The strata manager of claim 6, further comprising an off-stack output connected to the output of the off-chip driver on the first terminal stratum.

8. The strata manager of claim 6, further comprising an off-stratum output connection connected to an output of the off-chip driver on each of the two or more strata.

9. The strata manager of claim 1, further comprising a multiplexer on each of the two or more strata, the multiplexer having inputs connected to an output of a respective one of the plurality of scannable configuration registers on adjacent ones of the two or more strata in the stack and having an output connected to an input of one of the plurality of scannable configuration registers on a same one of the two or more strata.

10. The strata manager of claim 9, wherein the set of bits is configured to program the operation of the multiplexer on each of the two or more strata.

11. The strata manager of claim 9, wherein the multiplexer on each of the two or more strata is controlled by off-chip signals provided as a broadcast input to each of the two or more strata.

12. The strata manager of claim 1 further comprising a multiplexer on each of the two or more strata, the multiplexer having a first input connected to an output of an off chip receiver on the same one of the two or more strata and having a second input connected to the scan output of the strata manager of claim 1 on one of a different adjacent stratum and the output of the multiplexer connected to the scan input of the strata manager of claim 1 on the same one of the two or more strata.

13. The strata manager of claim 12, wherein the multiplexer on each of the two or more strata is controlled by a stack input that selectively enables forward direction or reverse direction serial inter-strata scan connections, a forward direction commencing from a first terminal stratum and ceasing at a second terminal stratum, and a reverse direction commencing from the second terminal stratum and ceasing at the first terminal stratum.

14. The strata manager of claim 13, further comprising a set of off-stack inputs and a set of off-stack outputs that respectively source a scan when operated in the forward direction or sink the scan when operated in the reverse direction.

15. The strata manager of claim 14, further comprising a set of off-chip inputs and a set of off-chip outputs that respectively source and sink a scan operated in the forward direction.

16. The strata manager of claim 1, further comprising a connection circuit for connecting the plurality of scannable configuration registers for at least one of off-chip access or off-stack access, and wherein the connection circuit has a connection topography that provides a separate scan path to each of the plurality of scannable configuration registers from connections located on a first terminal stratum from among the two or more strata.

17. The strata manager of claim 16, wherein the two or more strata are identical, and inclined TSV connections are used to provide access to the scannable configuration registers on each of the two or more strata.

18. A stratum identifier within a 3D chip stack having two or more strata and multiple integrated circuits, the stratum identifier comprising:

a plurality of stratum identification circuits, each arranged on a respective one of the two or more strata, and each having "N" inter-stratum inputs and "N" inter-stratum outputs, wherein n is an integer equal to or greater than 1, and $2^N$ is a number of the two or more strata, wherein the inter-stratum inputs from a respective one of the plurality of stratum identification circuits on each of the two or more strata are connected to and driven by the inter-stratum outputs from a different one of the plurality of stratum identification circuits on an adjacent one of the two or more strata, wherein inter-stratum input signals and inter-stratum output signals are provided as binary encoded values such that the inter-stratum output signals encode a value of the inter-stratum input signals incremented by 1, the inter-stratum output signals being available to at least some of the multiple integrated circuits on a same one of the two or more strata stratum so as to provide the encoded value therein as a unique binary pattern on each of the two or more strata.

19. The stratum identifier of claim 18, wherein the inter-stratum inputs on a first terminal stratum from among the two or more strata are connected to external logic signals supplied by a tester or a package.

20. The stratum identifier of claim 18, wherein the inter-stratum inputs are weakly held to a default value such that when the inter-stratum inputs are not connected to the different one of the plurality of stratum identification circuits on the adjacent one of the two or more strata, the inter-stratum inputs acquire a default value.

21. A stack-wide scan circuit within a 3D chip stack having two or more strata including a first terminal stratum and a second terminal stratum, the stack-wide scan circuit comprising:

a plurality of configurable scan chains, each including a scannable configuration register;

an off-stack accessible input port connected in a broadcast configuration to each of the plurality of scan chains;

an off-stack accessible output port on the first terminal stratum connected to a given one of the plurality of configurable scan chains on the first terminal stratum; and means for configuring the plurality of scan chains to selectively provide any of a plurality of different scan paths through the two or more strata.

22. The stack-wide scan circuit of claim 21, wherein the means for configuring configures the plurality of scan chains responsive to configuration bits stored in the scannable configuration register on one or more of the two or more strata.

23. The stack-wide scan circuit of claim 21, wherein the 3D chip stack comprises multiple integrated circuits, and at least some of the plurality of scan chains are connected to a respective one of the multiple integrated circuits on a same one or a different one of two or more strata.

* * * * *